（12) United States Patent
Lopatin

(10) Patent No.: US 6,368,965 B1
(45) Date of Patent: Apr. 9, 2002

(54) METHOD FOR LOW STRESS PLATING OF SEMICONDUCTOR VIAS AND CHANNELS

(75) Inventor: Sergey D. Lopatin, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/784,842

(22) Filed: Feb. 15, 2001

Related U.S. Application Data

(63) Continuation-in-part of application No. 09/276,840, filed on Mar. 26, 1999, now Pat. No. 6,340,633.

(51) Int. Cl.[7] ..................... H01L 21/44; H01L 21/4763
(52) U.S. Cl. ................ 438/676; 438/637; 438/641; 438/687
(58) Field of Search ......................... 438/676, 687, 438/758, 637, 640, 641

(56) References Cited

U.S. PATENT DOCUMENTS 5,972,192 A * 10/1999 Dubin et al. ................ 205/101

* cited by examiner

Primary Examiner—Alexander G. Ghyka
(74) Attorney, Agent, or Firm—Mikin Tshimaru

(57) ABSTRACT

A method is provided for forming conductive layers in semiconductor device channels and vias by using forward current and periodic pulse reverses for filling inward from the sidewalls of the channels and vias. The pulse reversals and inward filling reduce recrystallization rate to improve electromigration resistance and reduce the stress in the conductive layers to eliminate voids.

20 Claims, 3 Drawing Sheets

METHOD FOR LOW STRESS PLATING OF SEMICONDUCTOR VIAS AND CHANNELS

CROSS-REFERENCE TO RELATED APPLICATIONS

This is a continuation-in-part of application Ser. No. 09/276,840 filed Mar. 26, 1999 now U.S. Pat. No. 6,340,633, by Seigey D. Lopatin.

The present application contains subject matter related to an application entitled "Method for Ramped Current Density Plating of Semiconductor Vias and Trenches" by Sergey D. Lopatin and John A. Iacoponi. The related application was filed on Mar. 26, 1999, is identified by Ser. No. 09/276,839 now U.S. Pat. No. 6,330,633 and is commonly assigned to Advanced Micro Devices, Inc.

TECHNICAL FIELD

The present invention relates generally to semiconductors and more specifically to electroplating of conductors used in semiconductors.

BACKGROUND ART

In the manufacturing of integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

One metalization process, which is called the "damascene" technique, starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and a barrier layer is deposited to coat the walls of the first channel opening to ensure good adhesion and to act as a barrier material to prevent diffusion of such conductive material into the oxide layer and the semiconductor devices (the combination of the adhesion and barrier material is collectively referred to as "barrier layer" herein). A seed layer is then deposited on the barrier layer to form a conductive material base, or "seed", for subsequent deposition of conductive material. A conductive material is then deposited in the first channel openings and subjected to a chemical-mechanical polishing process which removes the first conductive material above the first channel oxide layer and damascenes the conductive material in the first channel openings to form the first channels.

For multiple layers of channels, another metalization process, which is called the "dual damascene" technique, is used in which the channels and vias are formed at the same time. In one example, the via formation step of the dual damascene technique starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate via areas over the first channels.

A nitride etch is then used to etch out the via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. A barrier layer is then deposited to coat the via openings and the second channel openings. Next, a seed layer is deposited on the barrier layer. This is followed by an electroplating of the conductive material on the seed layer in the second channel openings and the via openings to form the second channel and the via. A second chemical-mechanical polishing process leaves the two vertically separated, horizontally perpendicular channels connected by a via.

The use of the damascene techniques eliminates metal etch and dielectric gap fill steps typically used in the metalization process. The elimination of metal etch steps is important as the semiconductor industry moves from aluminum to other metalization materials, such as copper, which are very difficult to etch.

One drawback of using copper is that copper electroplating is a slow process which means that manufacturing throughput is relatively low.

When the current density of the electroplating process is increased to speed deposition, there is a tendency for voids to form in the vias. This tends to increase current density further, which increases the size of the voids until open circuits occur.

A fast, but low stress method of electroplating has been long sought but has eluded those skilled in the art. As the semiconductor industry is moving from aluminum to copper and other type of materials with greater electrical conductivity and thinner channels and vias, it is becoming more pressing that a solution be found.

DISCLOSURE OF THE INVENTION

The present invention provides a method for forming conductive layers in semiconductor channels and vias by using pulse reversal periods during the electroplating process. A forward pulse or forward direct current allows fast deposition while the pulse reversals reduce the stress to eliminate voids. This speeds up the overall manufacturing process while preventing void formation.

The present invention provides a method for forming conductive layers in semiconductor channels and vias by using forward direct current deposition with pulse reversals for the electroplating process. This speeds up the overall manufacturing process and deposits void-free conductive layers.

The present invention provides a method for forming conductive layers in semiconductor channels and vias by using pulse reverse current for the electroplating process. This speeds up the overall manufacturing process and deposits its void-free conductive layers.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
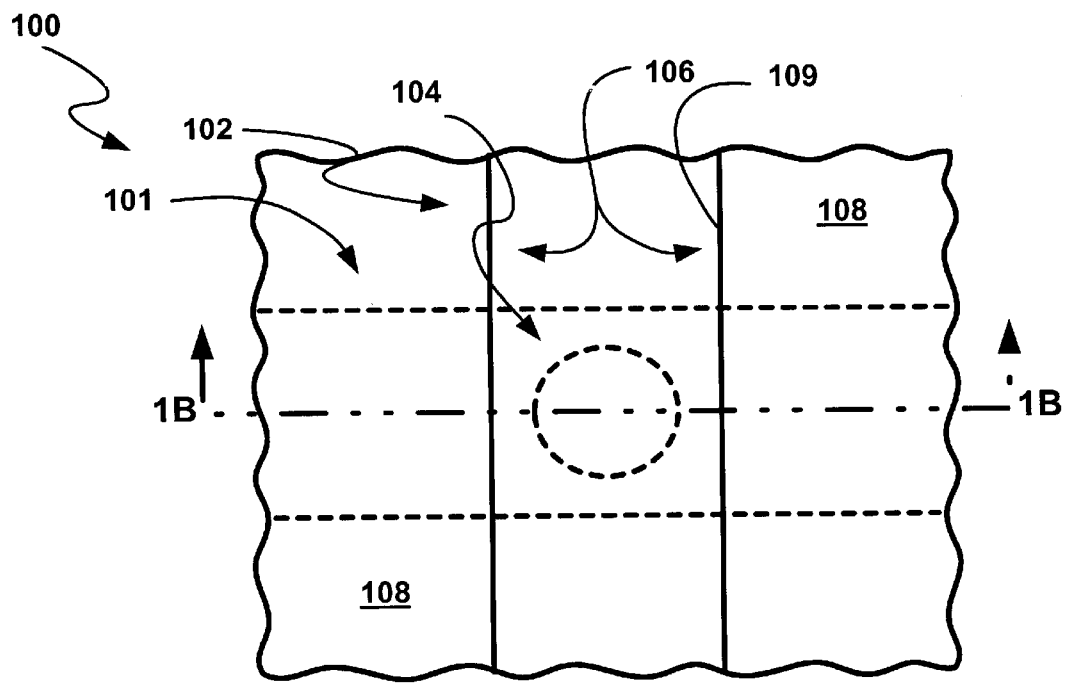
FIG. 1A (PRIOR ART) is a plan view of aligned channels with a prior art via.

Referring now to FIG. 1A (PRIOR ART), therein is shown a plan view of a prior art pair of perpendicularly aligned semiconductor channels of a conductive material such as aluminum, copper, tungsten or polysilicon disposed over a semiconductor wafer 100. A first channel 101 is shown disposed below a second channel 102 which extends substantially perpendicular to the first channel 101 in the plan view. A via 104 connects the first and second channels 101 and 102 and is a part of the second channel 102. The first channel comprises a first conductive material. The second channel 102 is formed by filling a second channel opening 106 disposed in a second channel oxide layer 108 with a second conductive material. The second channel opening 106 is defined by sidewalls 109 of the second channel oxide layer 108.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 1B:
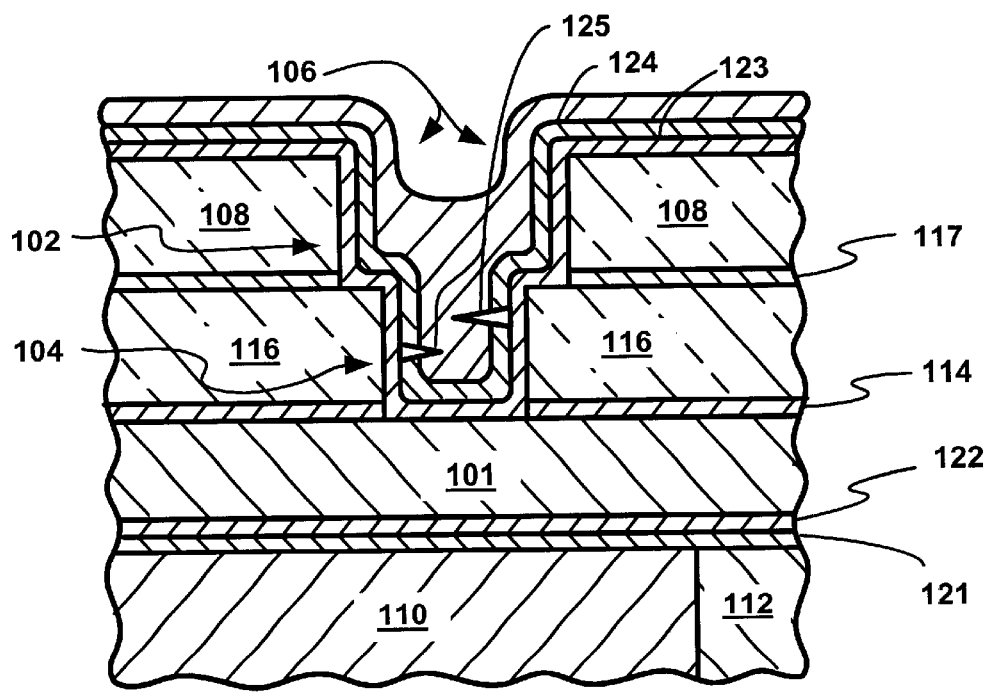
FIG. 1B (PRIOR ART) is a cross-section of FIG. 1A (PRIOR ART) along line 1B—1B.

Referring now to FIG. 1B (PRIOR ART), therein is shown a cross-section of FIG. 1A (PRIOR ART) along 1B—1B. The first channel 101 is disposed over a polysilicon gate 110 and a device dielectric layer 112 of a semiconductor device on an integrated circuit chip (not shown). The first and second channels 101 and 102 are in horizontal planes separated vertically by a stop nitride layer 114, a via oxide layer 116, and a thin via nitride layer 117.

Also shown are a barrier layer 121 and a seed layer 122 which are part of the first channel 101, and a barrier layer 123 and a seed layer 124 which are part of the second channel 102 and the via 104. The barrier layers 121 and 123 include barrier material combinations such as titanium/titanium nitride and tantalum/tantalum nitride for the seed layers 122 and 124 of copper or copper alloy conductive materials.

In electroplating semiconductor interconnects in the past, the semiconductor wafer 100 was placed in an electroplating bath having a solution of the conductive material ions with a leveling agent and brightener. For the first channel 101, the seed layer 122 would be used as an electrode for the conductive material to be deposited upon to fill the channel opening sequentially from the bottom up. Similarly, for the via 104 and the second channel 102, the seed layer 124 would be used as the electrode. Again, the filling would be from the bottom up and FIG. 1B (PRIOR ART) shows the second channel 102 partially filled.

A number of different techniques of applying the plating current were used. Two approaches were direct current and forward pulse current. The current densities of these approaches were constant with the compromise being made between trying to obtain a slow recrystallization of the deposited conductive material for increased conductor electromigration resistance while avoiding void formation verses the time the process took.

These processes result in high stress in the deposited conductive material, especially in the deposited conductive material in the via 104. This high stress causes stress related voiding which are voids 125 in the via 104.

Figure 2:
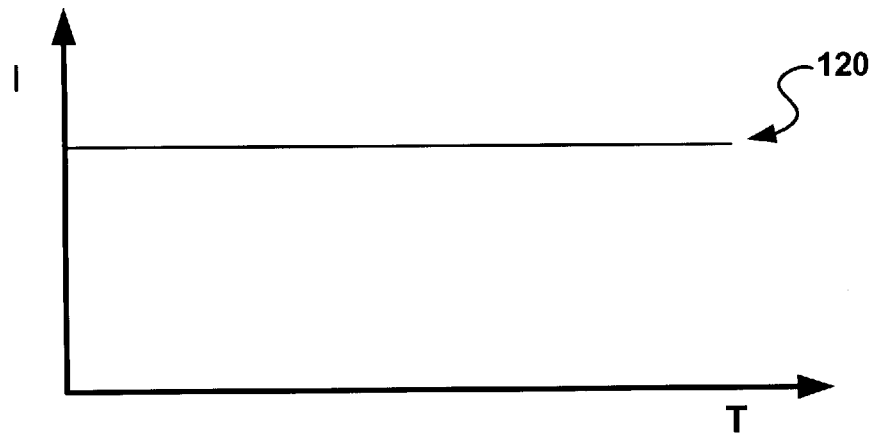
FIG. 2 (PRIOR ART) is a chart of a direct current used for electroplating.

Referring now to FIG. 2 (PRIOR ART), therein is shown a chart of a direct current 120 used for electroplating. The direct current 120 provides a fast, but high recrystallization rate and high stress deposition, of conductive material ions. With the current flow around 0.5 to 7.0 amps, voids 125 will be formed in the via 104 and in the sidewalls of the first and second channels 101 and 102.

Figure 3:
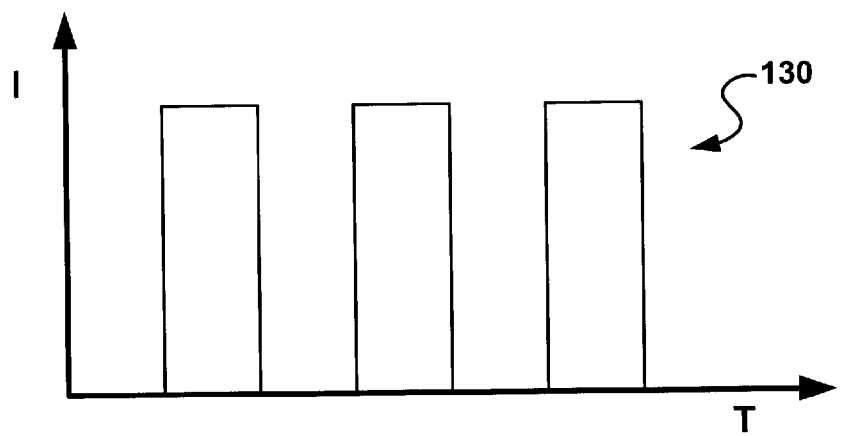
FIG. 3 (PRIOR ART) is a chart of a forward pulse current used for electroplating.

Referring now to FIG. 3 (PRIOR ART), therein is shown a chart of a forward pulse current 130. While it is understood that the forward pulse current 130 applies a large number of pulses, three pulses are exemplary of the forward pulse current 130 being applied, which is about 0.5 to 7.0 amps with an on-time of 0.5 to 15 ms. The forward pulse current approach allows relatively low stress, void-free deposition of conductive material ions on the seed layers 122 and 124 of the first and second channels 101 and 102 during electrodeposition. However, where the via 104 has a high aspect ratio and is very small, the voids 125, as shown in FIG. 1B (PRIOR ART), will be formed occasionally in the via 104.

Figure 4:
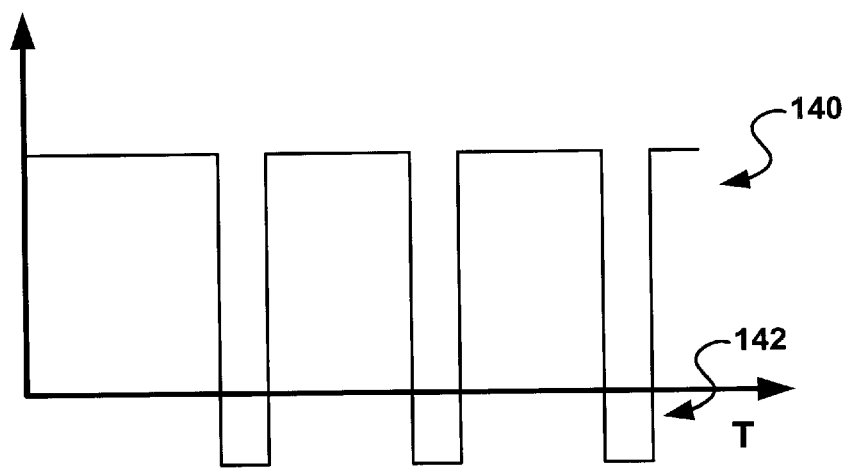
FIG. 4 is a chart of a direct current with periodic current reversal used for electroplating in accordance with the present invention.

Referring now to FIG. 4, therein is shown a chart of a direct current 140 which is interrupted by a periodic current reversal 142. Unfortunately, the direct current 140 with the periodic current reversal 142 (three shown) requires leveling agents in the electroplating solution to assure bottom up filling of the via 104 to prevent voids in the bottom of the via 104 where there is often incomplete seed layer 124 coverage because of a high aspect ratio.

Figure 5:
FIG. 5 is a chart of a forward pulse current with pulse reverse current and pauses used for electroplating in accordance the present invention.

Referring now to FIG. 5, therein is shown a chart of a forward pulse current 150 with a pulse reverse current 152. While it is understood that the forward pulse current 150 and the pulse reverse current 152 apply a large number of pulses, three pulses of each are exemplary of the current being applied. The forward pulse current 150 is shown with the pulse reverse current 152 in between of lower amperage and duration than the forward pulse current 150.

During research into void formation in copper interconnects although there are many complex interrelationships, it was found that the degree of detrimental copper electromigration was decreased as recrystallization of copper film was decreased and the degree of voiding decreased with decreased copper film stress. Unfortunately, with existing processes, decreased recrystallization generally increased copper film stress and vice versa. Where decreased recrystallization could be obtained with decreased copper film stress, the process required prohibitively time consuming processes.

After considerable study, it was determined that the stress in electroplated copper film varied with the waveform of the current applied during electroplating. The stress in copper film decreased from the direct current 120 of FIG. 2 (PRIOR ART) to the forward pulse current 130 of FIG. 3 (PRIOR ART) and further to the direct current 140 with the periodic current reversal 142 and leveling agent of FIG. 4. At the same time, the process time detrimentally increased from direct current electroplating as a function of the off-time or pulse reverse duration.

At the same time, it was observed that the recrystallization rate electroplated copper film varied with the waveform of the current applied during electroplating. The recrystallization rate in copper film decreased from the direct current 120 of FIG. 2 (PRIOR ART) to the forward pulse current 130 of FIG. 3 (PRIOR ART) and further to the direct current 140 which is interrupted by periodic current reversals 142 and leveling agent of FIG. 4 for both room temperature and high temperature recrystallizations. At the same time, the process time detrimentally increased from direct current electroplating as a function of the off-time or pulse reverse duration.

To reduce the process time, it was discovered that the waveforms could be used sequentially from: the forward pulse current 150 with the pulse reverse current 152 of FIG. 5 to produce filling of the conductive material from the seed material on the sidewalls inward; and then the forward pulse current 130 of FIG. 3 (PRIOR ART), the direct current 140 which is interrupted by periodic current reversals 142 of FIG. 4, and/or the direct current 120 of FIG. 2 (PRIOR ART).

It was further discovered that a lower averaged current of the periodic current reverse 142 of FIG. 4 provided further decreasing of the stress and the recrystallization rate. This resulted in the use of the forward pulse current 150 and the pulse reverse current 152 with a pause 154 in between as shown in FIG. 5. The amperage and duration of the forward pulse current 150 and the pulse reverse current 152 as well as the duration of the pause 154 are heuristically determined.

It was still further discovered the effect of a first leveling agent in the electroplating solution can be improved by the addition of a second leveling agent that has similar composition to first leveling agent but has significantly higher molecular weight.

This provides (in addition to enhanced bottom deposition rate in via) significant improvement of uniformity of top surface of a copper film after use of the forward pulse current 150 and the pulse reverse current 152 of FIG. 5 in electroplating over large chip surface areas of the wafer. The second leveling agent averages deposition rates over dense and not dense patterns over the damascene surface of the entire semiconductor wafer and levels the top copper surface.

It was still further discovered that the first leveling agent in the electroplating solution can be improved by the addition of a third leveling agent that has a similar composition to first leveling agent but has significantly lower molecular weight.

This provides (in addition to enhanced bottom deposition rate in via and significant improvement of uniformity over large chip surface areas) an increased uniformity in the area of single separated via/trench. The third leveling agent averages deposition rates over the single separated via/trench and over the flat top surface near the via/trench and levels the top copper surface at a single pitch.

Figure 6:
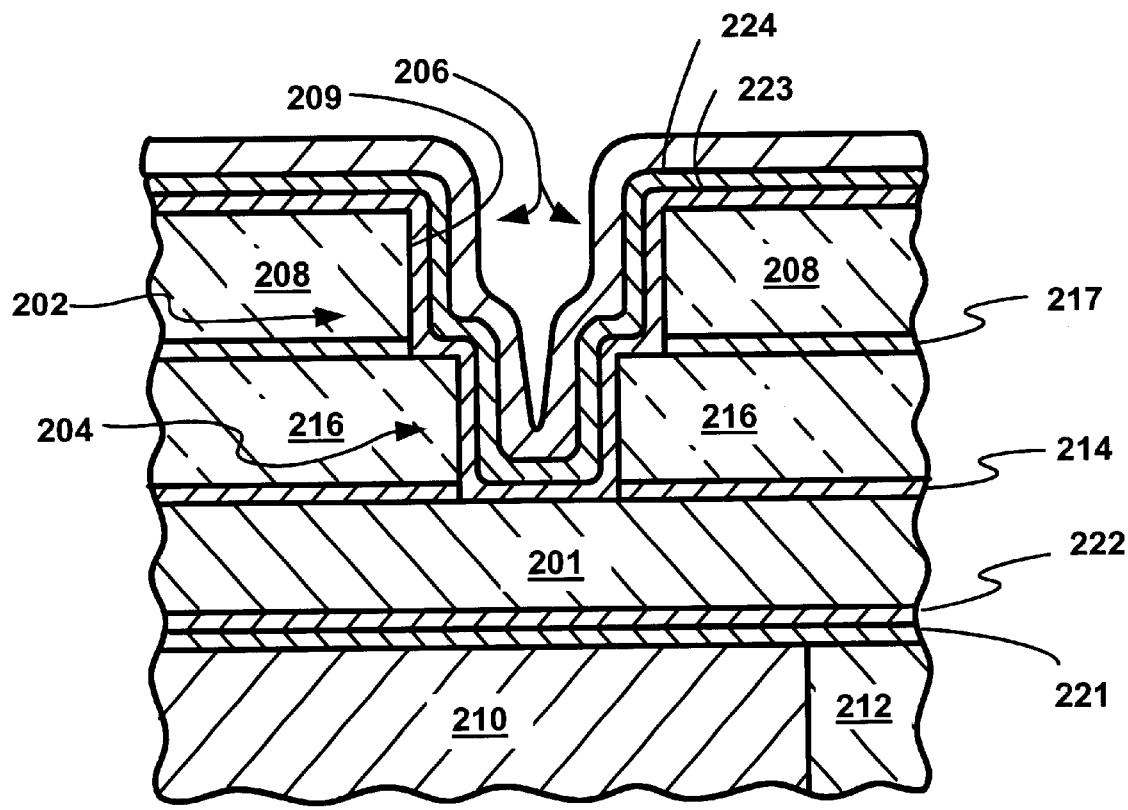
FIG. 6 is a cross-section similar to FIG. 1B (PRIOR ART) showing the inward filling of a channel and via in accordance with the present invention.

Referring now to FIG. 6, therein is shown a cross-section similar to FIG. 1B (PRIOR ART) showing a step in the process of the present invention. A first channel 201 is disposed over a polysilicon gate 210 and a dielectric 212 of a semiconductor device on an integrated circuit chip (not shown). A second channel 202 extends substantially perpendicular to the first channel 201. A via 204 connects the first and second channels 201 and 202 and is a part of the second channel 202. The first channel comprises a first conductive material. The second channel 202 is formed by filling a second channel opening 206 disposed in a second channel oxide layer 208 with a second conductive material. The second channel opening 206 is defined by sidewalls 209 of the second channel oxide layer 208. The first and second channels 201 and 202 are in horizontal planes separated vertically by a stop nitride layer 214, a via oxide layer 216, and a via nitride layer 217.

Also shown are a barrier layer 221 and a seed layer 222 which are part of the first channel 201, and a barrier layer 223 and a seed layer 224 which are part of the second channel 202 and the via 204.

In electroplating semiconductor interconnects in accordance with the present invention, the semiconductor wafer (not shown) is placed in an electroplating bath having a solution of the conductive material ions with a leveling agent and brightener. For the first channel 201, the seed layer 222 would be used as an electrode for the conductive material to be deposited upon to fill the channel opening from the sidewalls inward. Similarly, for the via 204 and the second channel 202, the seed layer 224 would be used as the electrode. Again, the filling would be from the sidewalls inward and FIG. 6 shows the second channel 202 partially filled.

In production, a conventional first damascene process is used to dispose the first channel 201 in a first channel oxide layer (not shown) above a semiconductor wafer (not shown). The damascene process is a photolithographic process which uses a mask to define a first channel opening (not shown) in the first channel oxide layer. The first channel opening is then filled with the adhesion/barrier layer 221, the seed layer 222, and the first conductive material, such as copper, to form the first channel 201 using the direct current 120 or forward pulse current 130 electroplating technique. The stop nitride layer 214, the via oxide layer 216, and the via nitride layer 217 would be successively deposited on top of the first channel 201 and the first channel oxide layer using conventional deposition techniques.

By using the via photoresist and the via photolithographic process followed by nitride etching of the via 204 in the via nitride layer 217, the basis for the via 104 is formed. The subsequent deposition of the second channel oxide layer 208 prepares the way for the second channel 202 to be perpendicular to the first channel 201.

The second damascene process uses a further mask to define the second channel opening 206 in the second channel oxide layer 208. Since the second damascene process uses an anisotropic oxide etch, the etch also forms the opening for the via 204 down to the stop nitride layer 214. The anisotropic oxide etch etches faster in the vertical direction of FIG. 6 than in the horizontal direction. The nitride etch of the stop nitride layer 214 exposes a portion of the first channel 201 and completes the etching steps.

Next, the adhesion/barrier layer 223 is deposited in the second channel opening 206 and the opening of the via 204, including along the sidewalls. The thickness of the adhesion/barrier material 223 is insufficient to fill the second channel opening 206 and the opening for the via 204. The adhesion/barrier layer 223 is deposited using conventional deposition techniques, such as physical vapor deposition, chemical vapor deposition, or a combination thereof Thereafter, the seed layer 224 is deposited on the adhesion/barrier layer 223 in the second channel opening 206 and the opening for the via 204. Again, the thickness of the seed layer 224 is insufficient to fill the second channel opening 106 and the opening for the via 204. The seed layer 224 is deposited using a conventional metal deposition technique such as ion metal plasma (IMP) or hollow cathode metalization (HCM). In these processes, the metal ions are charged and directed toward the silicon wafer to be deposited.

Next, the second conductive material is electroplated on to the seed layer 224 in the second channel opening 206 and the opening for the via 204 to fill inward from the sidewalls by initially using that the forward pulse current 150 and the pulse reverse current 152 followed by the direct current 120 and/or the direct current 140 which is interrupted by the periodic current reversal 142. The electroplating solution contains a first leveling agent sufficient to cause complete bottom plating of the via 204, a second leveling agent with a significantly higher molecular weight than the first leveling agent, and/or a third leveling agent with a significantly lower molecular weight than the first leveling agent.

Thereafter, a chemical mechanical polishing process is used to planarize the adhesion/barrier layer 223, the seed layer 224, and the second conductive material with the second channel layer 208 to complete the process.

In various embodiments, the adhesion/barrier layers are of materials such as tantalum (Ta), titanium (Ti), tungsten (W), compounds thereof, and combinations thereof. The seed layers (where used) are of materials such as copper (Cu), gold (Au), silver (Ag), compounds thereof and combinations thereof with one or more of the above elements. The conductor cores with or without seed layers are of materials such as copper, aluminum (Al), gold, silver, compounds thereof, and combinations thereof. The dielectric first and second channel layers are of dielectric materials such as silicon oxide ($SiO_x$), tetraethoxysilane (TEOS), borophosphosilicate (BPSG) glass, etc. with dielectric constants from 4.2 to 3.9 or low dielectric constant dielectric materials such as fluorinated tetraethoxysilane (FTEOS), hydrogen silsesquioxane (HSQ), benzocyclobutene (BCB), etc. with dielectric constants below 3.9. The stop layers and capping layers (where used) are of materials such as silicon nitride ($Si_xN_x$), silicon oxynitride (SiON) or dielectric constant materials such as silicon carbide (SiC) with dielectric constants below 5.5.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. A method of manufacturing a semiconductor device, comprising:
   providing a semiconductor with a dielectric layer formed thereon, wherein said dielectric layer overlays a region on said semiconductor;
   forming an opening in said dielectric layer, said opening defined by walls of said dielectric layer and connected to a portion of said region on said semiconductor;
   forming a seed layer over said dielectric layer and in said opening, including along said walls, said seed layer formed to a thickness insufficient to fill said opening; and
   depositing a layer of conductive material in contact with said seed layer by electroplating using forward pulse current and pulse reverse current to cause said layer of conductive material to fill said opening inward from said walls.

2. The method as claimed in claim 1 wherein depositing said layer of conductive material uses a current having a pause between said forward pulse current and said pulse reverse current.

3. The method as claimed in claim 1 wherein depositing said layer of conductive material has said pulse reverse current of less amperage and shorter duration than said forward pulse current.

4. The method as claimed in claim 1 including depositing a further layer of conductive material in contact with said layer of conductive material by using current selected from a group consisting of direct current, direct current interrupted by periodic current reversals, and forward pulse current and pulse reverse current.

5. The method as claimed in claim 1 wherein depositing said layer of conductive material is performed in a solution containing a first and second leveling agents, said second leveling agent having a higher molecular weight than said first leveling agent.

6. The method as claimed in claim 1 wherein depositing said layer of conductive material is performed in a solution containing a first and second leveling agents, said second leveling agent having a lower molecular weight than said first leveling agent.

7. The method as claimed in claim 1 wherein depositing said layer of conductive material is performed in a solution containing a first, second, and third leveling agents, said second leveling agent having a higher molecular weight than said first leveling agent and said third leveling agent having a lower molecular weight than said first leveling agent.

8. The method as claimed in claim 1 wherein depositing said layer of conductive material is performed using a conductive material selected from a group consisting of copper, gold, silver, an alloy thereof, and a combination thereof.

9. The method as claimed in claim 1 including depositing an adhesion/barrier layer over said dielectric layer before forming said seed layer, said depositing of adhesion/barrier layer using a material selected from a group consisting of tantalum, titanium, tungsten, a compound thereof, and a combination thereof.

10. The method as claimed in claim 1 including planarizing said adhesion/barrier layer, said seed layer, and said conductive material to be coplanar with said dielectric layer.

11. A method of manufacturing a semiconductor device, comprising:
   providing a semiconductor with a dielectric layer formed thereon, wherein said dielectric layer overlays a region on said semiconductor;
   forming a channel and a via opening in said dielectric layer, said channel and via opening defined by sidewalls of said dielectric layer and connecting to a portion of said region on said semiconductor;
   forming a seed layer over said dielectric layer and in said channel and via opening, including along said sidewalls, said seed layer formed to a thickness insufficient to fill said channel and via opening;
   depositing a layer of conductive material in contact with said seed layer by a first electroplating process using forward pulse current and pulse reverse current to cause said layer of conductive material to fill said via opening inward from said sidewalls; and depositing a further layer of conductive material by a second electroplating process faster than said first electroplating process to fill said channel opening inward from said sidewalls.

12. The method as claimed in claim 11 wherein depositing said layer of conductive material uses a current having a pause between said forward pulse current and said pulse reverse current.

13. The method as claimed in claim 11 wherein depositing said layer of conductive material has said pulse reverse current of less amperage and shorter duration than said forward pulse current.

14. The method as claimed in claim 11 wherein depositing said further layer of conductive material uses a current selected from a group consisting of direct current, direct current interrupted by periodic current reversals, and forward pulse current and pulse reverse current.

15. The method as claimed in claim 11 wherein depositing said layer of conductive material is performed in an electroplating solution containing a first and second leveling agents, said second leveling agent having a higher molecular weight than said first leveling agent.

16. The method as claimed in claim 11 wherein depositing said layer of conductive material is performed in an electroplating solution containing a first and second leveling agents, said second leveling agent having a lower molecular weight than said first leveling agent.

17. The method as claimed in claim 11 wherein depositing said layer of conductive material is performed in an electroplating solution containing a first, second, and third leveling agents, said second leveling agent having a higher molecular weight than said first leveling agent and said third leveling agent having a lower molecular weight than said first leveling agent.

18. The method as claimed in claim 11 wherein depositing said layer of conductive material is performed using a conductive material selected from a group consisting of copper, gold, silver, an alloy thereof, and a combination thereof.

19. The method as claimed in claim 11 including depositing an adhesion/barrier layer over said dielectric layer before forming said seed layer, said depositing of adhesion/barrier layer using a material selected from a group consisting of tantalum, titanium, tungsten, a compound thereof, and a combination thereof.

20. The method as claimed in claim 11 including planarizing said adhesion/barrier layer, said seed layer, and said conductive material to be coplanar with said dielectric layer.

* * * * *

UNITED STATES PATENT AND TRADEMARK OFFICE
CERTIFICATE OF CORRECTION

PATENT NO. : 6,368,965 B1
DATED : April 9, 2002
INVENTOR(S) : Lopatin

It is certified that error appears in the above-identified patent and that said Letters Patent is hereby corrected as shown below:

Title page,
Item [74], *Attorney, Agent or Firm,* delete "Mikin Tshimaru" and insert therefor
-- Mikio Ishimaru --
Item [56], References Cited, delete "Seigey;" and insert therefor -- Sergey --

Signed and Sealed this

Fourth Day of June, 2002

*Attest:*

JAMES E. ROGAN
*Attesting Officer*   *Director of the United States Patent and Trademark Office*

UNITED STATES PATENT AND TRADEMARK OFFICE
CERTIFICATE OF CORRECTION

PATENT NO.    : 6,368,965 B1
DATED         : April 9, 2002
INVENTOR(S)   : Lopatin It is certified that error appears in the above-identified patent and that said Letters Patent is hereby corrected as shown below:

<u>Column 1,</u>
Line 14, delete "6,330,633" and insert therefor -- 6,340,633 --

Signed and Sealed this

Thirteenth Day of August, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.     : 6,368,965 B1
DATED          : April 9, 2002
INVENTOR(S)    : Lopatin It is certified that error appears in the above-identified patent and that said Letters Patent is hereby corrected as shown below:

<u>Title page,</u>
Item [63], Related U.S. Application Data, delete "now Pat. No. 6,340,633" and insert therefor -- now abandoned --

<u>Column 1,</u>
Line 7, in the section CROSS-REFERENCE TO RELATED APPLICATIONS, delete "now U.S. Pat. No. 6,340,633" and insert therefor -- now abandoned --

Signed and Sealed this

Thirty-first Day of December, 2002

JAMES E. ROGAN
*Director of the United States Patent and Trademark Office*